United States Patent
Xu et al.

(10) Patent No.: US 10,621,494 B2
(45) Date of Patent: Apr. 14, 2020

(54) SYSTEM AND METHOD FOR CIRCUIT SIMULATION BASED ON RECURRENT NEURAL NETWORKS

(71) Applicant: Samsung Electronics Co., Ltd., Suwon-si, Gyeonggi-do (KR)

(72) Inventors: Nuo Xu, Milpitas, CA (US); Zhengping Jiang, San Jose, CA (US); Weiyi Qi, San Jose, CA (US); Jing Wang, San Jose, CA (US); Woosung Choi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 27 days.

(21) Appl. No.: 15/951,052

(22) Filed: Apr. 11, 2018

(65) Prior Publication Data

US 2019/0138897 A1 May 9, 2019

Related U.S. Application Data

(60) Provisional application No. 62/583,345, filed on Nov. 8, 2017.

(51) Int. Cl.
*G06F 17/50* (2006.01)
*G06N 3/08* (2006.01)
*G06N 3/04* (2006.01)

(52) U.S. Cl.
CPC .......... *G06N 3/08* (2013.01); *G06F 17/5036* (2013.01); *G06F 17/505* (2013.01)

(58) Field of Classification Search
CPC ........ G06N 3/08; G06N 3/0445; G06N 3/049; G06N 3/0635; G06N 3/126; G06N 20/00; G06N 3/04; G06N 3/084; G06N 5/022; G06N 5/045; G06N 3/0454; G06N 3/0481; G06F 17/50; G06F 17/5036;
(Continued)

(56) References Cited

U.S. PATENT DOCUMENTS

2003/0115164 A1 6/2003 Jeng et al.
2017/0091615 A1 3/2017 Liu et al.
(Continued)

OTHER PUBLICATIONS

Cao, Yazi et al.; Dynamic Behavioral Modeling of Nonlinear Microwave Devices Using Real-Time Recurrent Neural Network, Article, IEEE Transactions on Electron Devices, vol. 56, No. 5, May 5, 2009, IEEE, pp. 1020-1026.
(Continued)

*Primary Examiner* — Vuthe Siek
(74) *Attorney, Agent, or Firm* — Lewis Roca Rothgerber Christie LLP

(57) ABSTRACT

According to one embodiment of the present invention a circuit simulator configured to simulate a degraded output of a circuit including a plurality of transistors includes: a behavioral recurrent neural network configured to receive an input waveform and to compute a circuit output waveform; a feature engine configured to model one or more degraded circuit elements in accordance with an aging time, to receive the circuit output waveform and to output a plurality of degraded features; and a physics recurrent neural network configured to receive the plurality of degraded features from the feature engine and to simulate the degraded output of the circuit.

24 Claims, 11 Drawing Sheets

(58) Field of Classification Search
CPC ............ G06F 17/5063; G06F 2217/08; G06F 2217/36; G06F 17/5031; G06F 17/504; G06F 17/505; G06F 17/5059; G06F 17/5081; G06F 17/5095; G01R 31/007; G01R 31/3163; G06K 9/00771; G06K 9/00973; G06K 9/4628; G06K 9/6202; G06K 9/6215; G06K 9/6271; G06K 9/66; H03B 5/04; H03B 7/06; H03K 19/20
See application file for complete search history.

(56) References Cited

U.S. PATENT DOCUMENTS

2017/0098156 A1* 4/2017 Nino .................. G06N 3/049
2019/0121928 A1* 4/2019 Wu .................. G06F 17/5059

OTHER PUBLICATIONS

Ciminski, Andrzej S.; Recurrent Neural Networks Usefulness in Digital Pre-Distortion of Power Amplifiers, Article, 15th International Conference on Microwaves, Radar and Wireless Communications, IEEE, vol. 1, May 17, 2004, pp. 249-252.

Fang, Yonghua et al.; A New Macromodeling Approach for Nonlinear Microwave Circuits Based on Recurrent Neural Networks, Article, IEEE Transactions on Microwave Theory and Techniques, vol. 48, No. 12, Dec. 12, 2000, pp. 2335-2344.

Luongvinh, Danh et al.; Behavioral Modeling of Power Amplifiers Using Fully Recurrent Neural Networks, Article, IEEE MTT-S International Microwave Symposium Digest, Institute of Electrical and Electronics Engineers, Inc., Jun. 17, 2005, pp. 1979-1982.

* cited by examiner

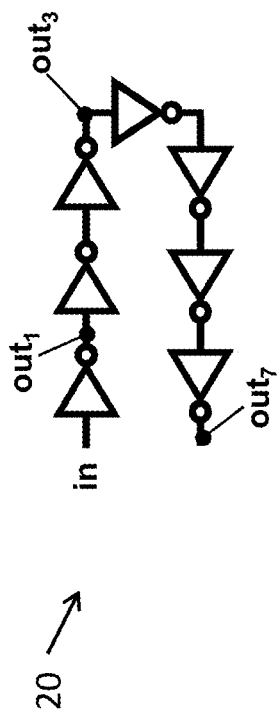
FIG. 2A
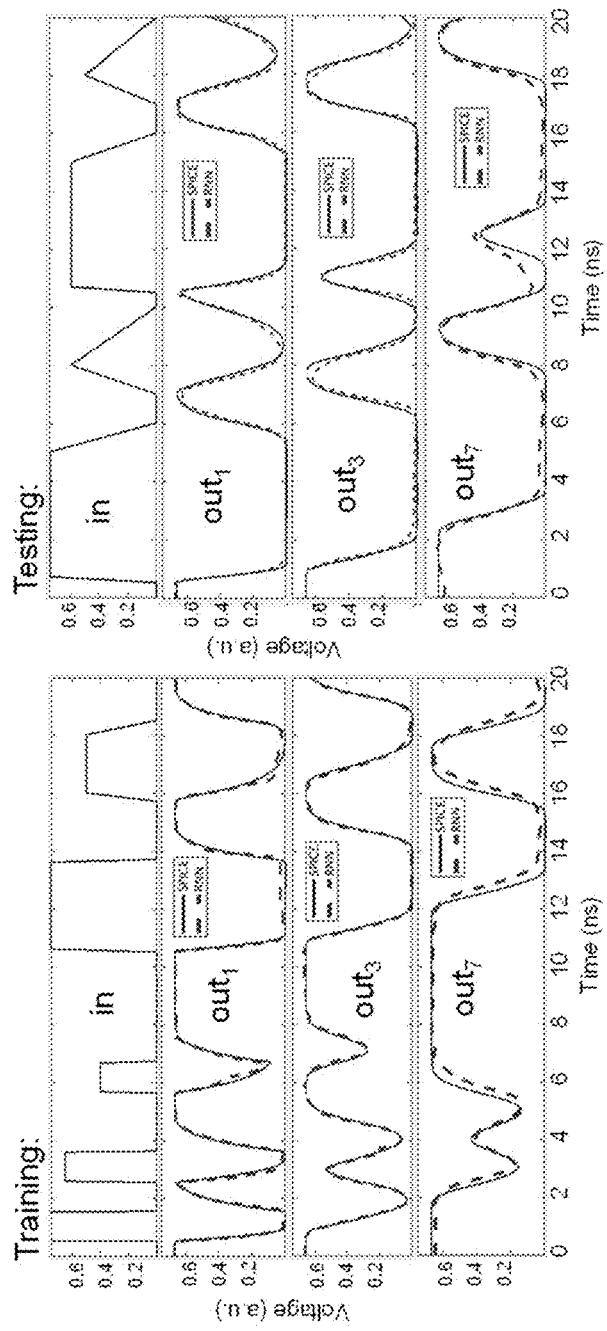
FIG. 2B
FIG. 2C

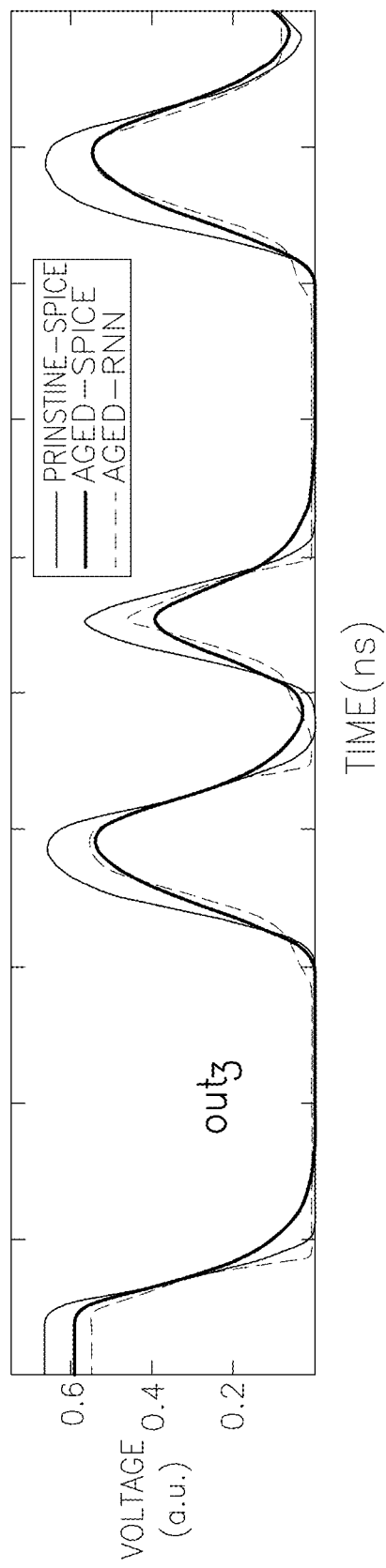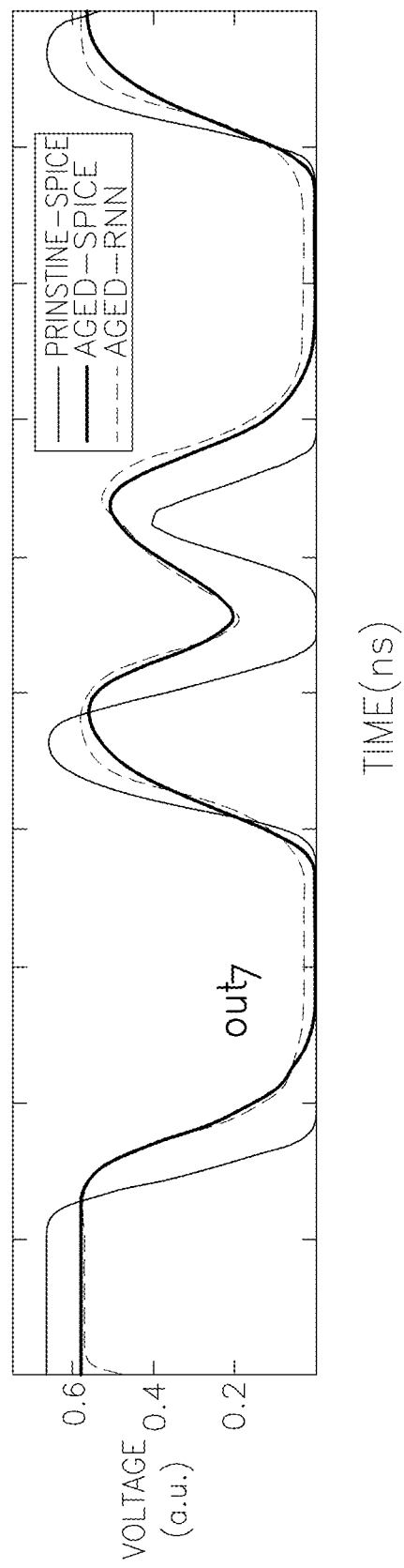

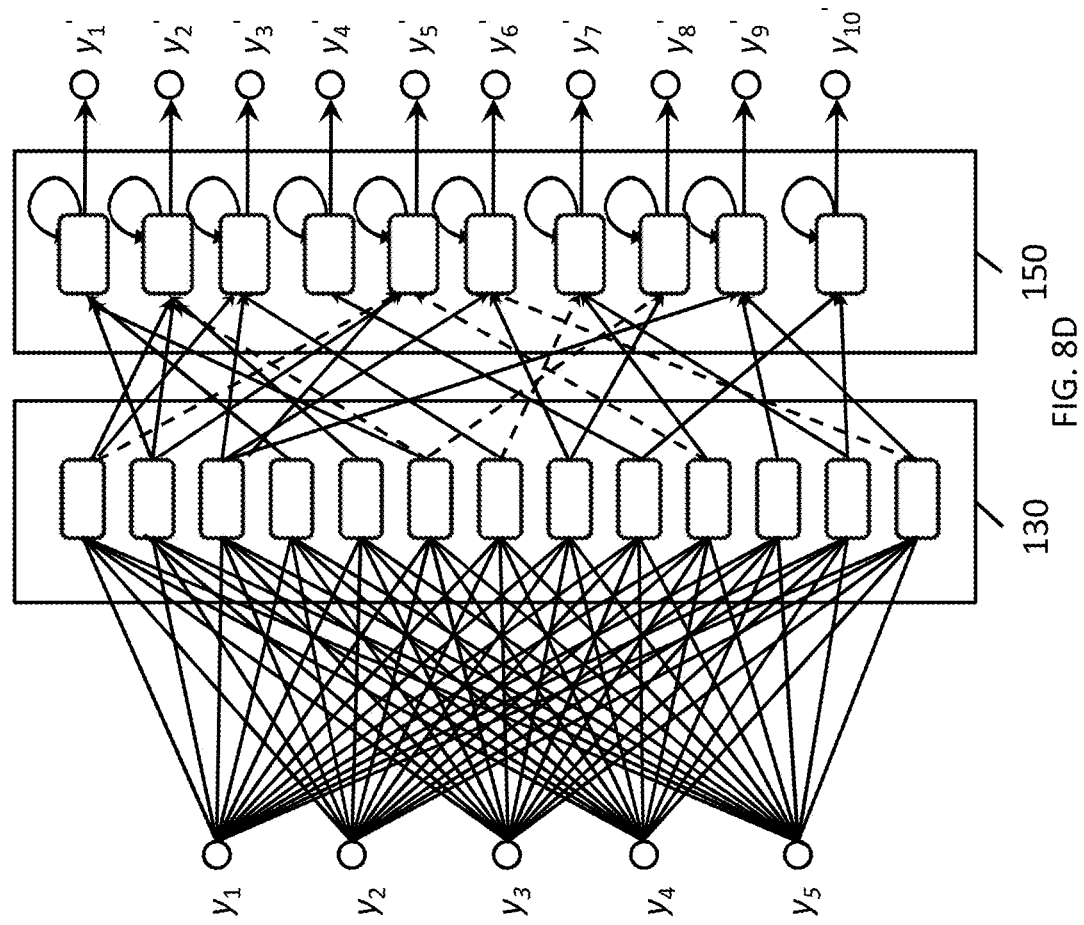

SYSTEM AND METHOD FOR CIRCUIT SIMULATION BASED ON RECURRENT NEURAL NETWORKS

CROSS-REFERENCE TO RELATED APPLICATION(S)

This application claims the benefit of U.S. Provisional Patent Application No. 62/583,345 "Efficient and Predictive Circuit Emulator Based on Physics-Inspired Recurrent Neural Networks," filed in the United States Patent and Trademark Office on Nov. 8, 2017, the entire disclosure of which is incorporated by reference herein.

BACKGROUND

Electrical circuit simulation is a part of an overall electronic design automation (EDA) process in which a computer system and/or processor simulates the operation of the circuit being designed. The simulation can be used to evaluate the performance of the circuit, such as operating ranges and noise tolerance. Electrical circuit simulation may also be used to evaluate the reliability of the circuit in the face of long-term (aging) effects of transistors on the time scales of, for example, thousands to millions of seconds of operating time.

However, comparative techniques for simulating the long term effects are typically very time consuming (often taking more than ten hours to run on current hardware) and computationally expensive using simulation tools such as Simulation Program with Integrated Circuit Emphasis (SPICE). Furthermore, aging effects are simulated through data post-processing steps, where the parameters of the transistors are modified in accordance with their aging, and another full simulation of the now aged circuit is performed.

In addition, making minor changes to the circuit design, such as changes to the inputs to the circuit or changes to transistor parameters, requires full re-simulation of the entire circuit, thereby incurring significant costs and discouraging the use of simulation to experiment with design changes and to perform feasibility studies.

SUMMARY

Aspects of embodiments of the present invention relate to systems and methods for simulating the operation of an electronic circuit using recurrent neural networks.

According to one embodiment of the present invention a circuit simulator configured to simulate a degraded output of a circuit including a plurality of transistors includes: a behavioral recurrent neural network configured to receive an input waveform and to compute a circuit output waveform; a feature engine configured to model one or more degraded circuit elements in accordance with an aging time, to receive the circuit output waveform and to output a plurality of degraded features; and a physics recurrent neural network configured to receive the plurality of degraded features from the feature engine and to simulate the degraded output of the circuit.

The behavioral recurrent neural network may be configured by a plurality of parameters, the parameters being trained in accordance with training data including: an input waveform; and simulated pristine circuit output waveforms of the circuit in response to the input waveform, simulated by a full circuit simulator.

The feature engine may be configured by a plurality of parameters, the parameters being trained in accordance with training data including simulated device behavior based on reliability models of the transistors of the circuit.

The physics recurrent neural network may be configured by a plurality of parameters, the parameters being trained in accordance with training data including: an input waveform; the degraded features computed by the feature engine; and simulated degraded circuit output waveforms of the circuit in response to the input waveform at a simulated aging time.

The behavioral recurrent neural network, the feature engine, and the physics recurrent neural network may be end-to-end trained by training data, the training data including: an input waveform; first simulated degraded circuit output waveforms of the circuit in response to the input waveform at a first simulated aging time, simulated by a full circuit simulator; and second simulated degraded circuit output waveforms of the circuit in response to the input waveform at a second simulated aging time, simulated by the full circuit simulator.

The feature engine may include a plurality of neurons, each neuron corresponding to one of the transistors of a plurality of representative and critical gates, the plurality of representative and critical gates being selected from among the transistors of the circuit in accordance with a decomposition method.

The feature engine may include a plurality of neurons, each neuron corresponding to one of the transistors of a plurality of representative and critical gates, the plurality of representative and critical gates being selected from among the transistors of the circuit in accordance with a critical delay path, most degraded gates, or most heavily used gates of the circuit.

The degraded features may be computed by the feature engine relate to bias-temperature instability, hot carrier injection, and random telegraph noise characteristics of the transistors of the circuit.

According to one embodiment of the present invention, a method for simulating a degraded output of a circuit including a plurality of transistors includes: supplying an input waveform to a behavioral recurrent neural network to compute a circuit output waveform; supplying the circuit output waveform to a feature engine configured to model one or more degraded circuit elements in accordance with an aging time to compute a plurality of degraded features; and supplying the plurality of degraded features to a physics recurrent neural network to simulate the degraded output of the circuit.

The behavioral recurrent neural network may be configured by a plurality of parameters, the parameters being trained in accordance with training data including: an input waveform; and simulated pristine circuit output waveforms of the circuit in response to the input waveform, simulated by a full circuit simulator.

The feature engine may be configured by a plurality of parameters, the parameters being trained in accordance with training data including simulated device behavior based on reliability models of the transistors of the circuit.

The physics recurrent neural network may be configured by a plurality of parameters, the parameters being trained in accordance with training data including: an input waveform; the degraded features computed by the feature engine; and simulated degraded circuit output waveforms of the circuit in response to the input waveform at a simulated aging time.

The behavioral recurrent neural network, the feature engine, and the physics recurrent neural network may be end-to-end trained by training data, the training data including: an input waveform; first simulated degraded circuit output waveforms of the circuit in response to the input waveform at a first simulated aging time, simulated by a full circuit simulator; and second simulated degraded circuit output waveforms of the circuit in response to the input waveform at a second simulated aging time, simulated by the full circuit simulator.

The method may further include selecting a plurality of representative and critical gates from among the transistors of the circuit in accordance with a decomposition method, wherein the feature engine may include a plurality of neurons, each neuron corresponding to one of the transistors of the plurality of representative and critical gates.

The method may further include selecting a plurality of representative and critical gates from among the transistors of the circuit in accordance with a critical delay path, most degraded gates, or most heavily used gates of the circuit, wherein the feature engine may include a plurality of neurons, each neuron corresponding to one of the transistors of the plurality of representative and critical gates.

The degraded features may be computed by the feature engine relate to bias-temperature instability and hot carrier injection characteristics of the transistors of the circuit.

According to one embodiment of the present invention, a system for simulating a degraded output of a circuit including a plurality of transistors includes: means for computing a circuit output waveform from an input waveform; means for computing a plurality of degraded features from the circuit output waveform; and means for simulating the degraded output of the circuit based on the plurality of degraded features.

The means for computing the circuit output waveform from the input waveform may include a behavioral recurrent neural network configured by a plurality of parameters, the parameters being trained in accordance with training data may include: an input waveform; and simulated pristine circuit output waveforms of the circuit in response to the input waveform, simulated by a full circuit simulator.

The means for computing the plurality of degraded features may include a feature engine configured by a plurality of parameters, the parameters being trained in accordance with training data including simulated device behavior based on reliability models of the transistors of the circuit.

The means for simulating the degraded output of the circuit may include a physics recurrent neural network configured by a plurality of parameters, the parameters being trained in accordance with training data including: an input waveform; the degraded features computed by the feature engine; and simulated degraded circuit output waveforms of the circuit in response to the input waveform at a simulated aging time.

The means for computing the circuit output waveform, the means for computing the plurality of degraded features, and the means for simulating the degraded output may be end-to-end trained by training data, the training data including: an input waveform; first simulated degraded circuit output waveforms of the circuit in response to the input waveform at a first simulated aging time, simulated by a full circuit simulator; and second simulated degraded circuit output waveforms of the circuit in response to the input waveform at a second simulated aging time, simulated by the full circuit simulator.

The system may further include means for selecting a plurality of representative and critical gates from among the transistors of the circuit in accordance with a decomposition method, wherein the means for computing the plurality of degraded features may include a plurality of neurons, each neuron corresponding to one of the transistors of the plurality of representative and critical gates.

The system may further include means for selecting a plurality of representative and critical gates from among the transistors of the circuit in accordance with a critical delay path, most degraded gates, or most heavily used gates of the circuit, wherein the means for computing the plurality of degraded features may include a plurality of neurons, each neuron corresponding to one of the transistors of the plurality of representative and critical gates.

The degraded features may relate to bias-temperature instability and hot carrier injection characteristics of the transistors of the circuit.

BRIEF DESCRIPTION OF THE DRAWINGS

The accompanying drawings, together with the specification, illustrate exemplary embodiments of the present invention, and, together with the description, serve to explain the principles of the present invention.

FIG. 2A is a circuit diagram of a circuit simulated by a behavioral RNN according to one embodiment of the present invention.

FIG. 2B is a set of waveforms showing a training input waveform supplied to a circuit, output waveforms at three different nodes of the circuit shown in FIG. 2A as computed by a comparative simulator, and output waveforms as computed by a behavioral RNN according to one embodiment of the present invention, trained based on the input waveforms and the output waveforms calculated by the comparative simulator.

FIG. 2C is a set of waveforms showing a testing input waveform supplied to a circuit, output waveforms at three different nodes of the circuit shown in FIG. 2A as computed by a comparative simulator, and output waveforms as computed by the behavioral RNN according to one embodiment of the present invention, trained based on the training data shown in FIG. 2B.

FIG. 7B depicts output waveforms at node $out_3$ of the multi-stage inverter circuit shown in FIG. 2A, as computed by a comparative circuit simulator simulating a pristine circuit ("Pristine-SPICE"), a comparative circuit simulator simulating an aged circuit ("Aged-SPICE"), and a recurrent neural network circuit simulator simulating an aged circuit ("Aged-RNN").

FIG. 7C depicts output waveforms at node $out_7$ of the multi-stage inverter circuit shown in FIG. 2A, as computed by a comparative circuit simulator simulating a pristine circuit ("Pristine-SPICE"), a comparative circuit simulator simulating an aged circuit ("Aged-SPICE"), and a recurrent neural network circuit simulator simulating an aged circuit ("Aged-RNN").

FIG. 8D is a schematic illustration of a portion of recurrent neural network including the feature engine 130 and the physics RNN 150 representing the JK flip flop-based decimal counter circuit shown in FIG. 8A.

DETAILED DESCRIPTION

Figure 1:
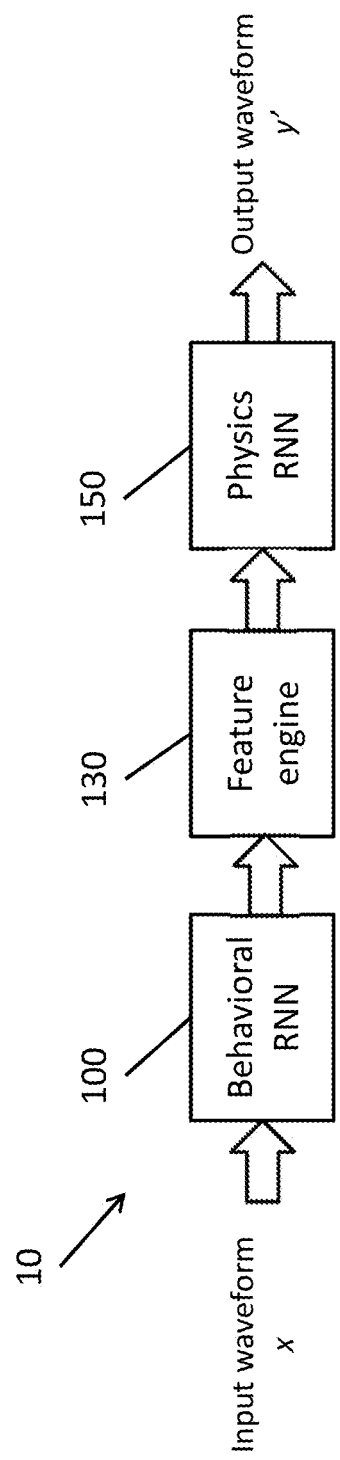
FIG. 1 is a block diagram illustrating a recurrent neural network circuit simulator according to one embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention relate to systems and methods for simulating the operation of an electronic circuit, such as an integrated circuit, using recurrent neural networks.

Circuit Element Reliability Characteristics

Current work in integrated circuit design benefits from design-technology co-optimizations (DTCO) because reliability challenges posed by smaller semiconductor manufacturing process nodes and transistor designs such as fin field effect transistors (FinFETs) can prompt different design choices.

One example of a design challenge is short-term noise effects such as random telegraph noise (RTN) as described, for example, in Miki, H., et al. "Understanding short-term BTI behavior through comprehensive observation of gate-voltage dependence of RTN in highly scaled high-K/metal-gate pFETs." *VLSI Technology (VLSI-T), 2011 Symposium on. IEEE,* 2011.

One example of a design challenge due to a long term effect is bias-temperature instability (BTI) smaller feature sizes may result in increased electrical noise levels and reduced long term stability of the semiconductor devices (e.g., transistors). See, e.g., Yu, Xiao, et al. "A Fast $V_{th}$ Measurement (FVM) Technique for NBTI Behavior Characterization." *IEEE Electron Device Letters* 39.2 (2017): 172-175.

Another example of a design challenge due to a long term effect is hot carrier injection (HCI) as described, for example, in Qu, Yiming, et al. "Ultra fast (<1 ns) electrical characterization of self-heating effect and its impact on hot carrier injection in 14 nm FinFETs." *Electron Devices Meeting (IEDM), 2017 IEEE International. IEEE,* 2017.

Accordingly, some aspects of embodiments of the present invention relate to modeling the behavior of transistors, taking into account short term (e.g., noise) effects and long term (e.g., aging) effects when simulating the long term behavior of a circuit.

Recurrent Neural Network Circuit Simulator Architecture

Some aspects of embodiments of the present invention relate to the use of a recurrent neural network to simulate a circuit. FIG. 1 is a block diagram illustrating a recurrent neural network circuit simulator according to one embodiment of the present invention.

Referring to FIG. 1, according to some embodiments, the recurrent neural network (RNN) circuit simulator 10 includes a behavioral recurrent neural network (RNN) 100, a feature engine 130, and a physics RNN (or physics-inspired RNN) 150. As will be described in more detail below, the behavioral RNN 100 is configured or trained to simulate the response of a particular pristine circuit (e.g., ideal circuit), and/or particular nodes within the pristine circuit, to input waveforms (e.g., to compute pristine waveforms). The feature engine 130 is configured to modify the waveforms output by the behavioral RNN 100 in accordance with activation functions inspired by models of the physical degradation of transistors (such as hot carrier injection and bias-temperature instability), as described more detail below. The physics RNN 150 is configured to compute an output waveform from the features computed by the feature engine 130. The physics RNN 150 is trained or configured to output a simulated waveform that reflects the physical degradation of (or other changes to) the circuit, as described in more detail below.

Behavioral Recurrent Neural Network (RNN)

Generally, an artificial neural network (ANN) or feedforward neural network (FNN) is a non-linear classifier or regressor that can approximate an arbitrary function. In such a neural network, a plurality of neurons is arranged into one or more layers. A neuron in a particular layer of receives inputs from one or more neurons of a previous layer and generates an output (referred to as an "activation"), which is transmitted to one or more neurons of the next layer in the neural network, or generates an output value, in the case of the last layer or output layer of the neural network.

More formally, in some artificial neural networks, a single neuron (labeled as neuron j of a layer u, herein) computes a weighted sum $z_j$ of its inputs x by multiplying those inputs x by weights W:

$$z_j = \sum_{i=1}^{p} W_{u,i} x_{n,i} + b_j$$

where the inputs to the neuron are index by the variable i, where $b_j$ is a constant or bias value that is added to the sum, where n refers to a current "time" value in the case where the input x is a sequence of values (e.g., where the input x is represented as a sequence of values over time). The resulting sum $z_j$ may then be supplied to an activation function g to compute the output $y_j$ of the neuron:

$$y_j = g^{(j)}(z_j)$$

where the activation function g may be a non-linear function such as the sigmoid function, the rectifier function (ReLU), the softplus function, hyperbolic tan (tan h), the exponential function (exp), and the like. As seen above, the output of a neuron in a feedforward neural network (FNN) is based only on the values of its inputs at one point (e.g., time n).

In contrast, a recurrent neural network (RNN) is a neural network that "memorizes" its states (e.g., values computed from prior input values) when calculating a new output value. Intuitively, the output ($y_n$) of a neuron at time n may be expressed as a function of all of the previous input values, e.g.:

$$y_n \sim f(x_n, x_{n-1}, \ldots, x_2, x_1)$$

More precisely, the "hidden state" output $h_{n,j}$ of a given neuron can be expressed as the weighted sum of its inputs x (similar to the FNN), a bias $b_j$, and its previous hidden state $h_{n-1}$:

$$h_{n,j} = g^{(j)}\left(W_{h,j} h_{n-1,j} + \sum_i W_{u,i} x_{n,i} + b_j\right)$$

where $W_{h,j}$ is a weight for the hidden state, and where g is an activation function (e.g., a non-linear activation function) as described before. The output of the neural network a time n (expressed as $y_n$) is a weighted sum of the outputs of the neurons of the output layer o:

$$y_n = \sum_j W_{o,j} h_{n,j} + c$$

where $W_{o,j}$ is a vector representing the weights applied to the outputs $h_{n,j}$ of the output layer o, and where c is a bias term.

This structure of a recurrent neural network can be applied to the simulation of a circuit, as the input waveform can be expressed as a sequence of values ($x_1, x_2, \ldots, x_n$) (e.g., as a discrete time sampling of a continuous waveform of voltage values) and the recurrent structure of the network allows previous values to influence future values (e.g., accounting for hysteresis). Likewise, the output is computed as a sequence of values ($y_1, y_2, \ldots, y_n$) and therefore is also suited for representing an output waveform of voltage values.

According to some embodiments of the present invention, the behavioral RNN 100 follows a multi-layer RNN architecture with a local feedback path on each hidden layer, and where hyperbolic tangent (tan h) is used as the activation function g in the hidden layers and the sigmoid function is used as the activation function g in the output layer of the RNN, where the value of the output is scaled to fall within the range of possible voltages for the circuit node (or nodes) simulated by the circuit (e.g., between power supply voltage $V_{DD}$ and ground GND).

FIG. 2A is a circuit diagram of a circuit simulated by a behavioral RNN according to one embodiment of the present invention. As seen in FIG. 2A, the test example is a multi-stage inverter circuit 20 that includes seven inverters coupled in series. Input node in supplies an input waveform to the input of the first inverter, and output nodes $out_1$, $out_3$, and $out_7$ at the outputs of the first, third, and seventh inverters, respectively, were selected for simulation.

FIG. 2B is a set of waveforms showing an input waveform supplied to a circuit, output waveforms at three different nodes of the circuit shown in FIG. 2A as computed by a comparative simulator, and output waveforms as computed by a behavioral RNN consists of 2 activation layers and 4 recurrent neurons per layer according to one embodiment of the present invention, trained based on the input waveforms and the output waveforms calculated by the comparative simulator. The comparative simulator in this example is Simulation Program with Integrated Circuit Emphasis (SPICE), which generated the waveforms shown in solid lines, and the output of the behavioral RNN is shown with dashed lines.

Figure 3:
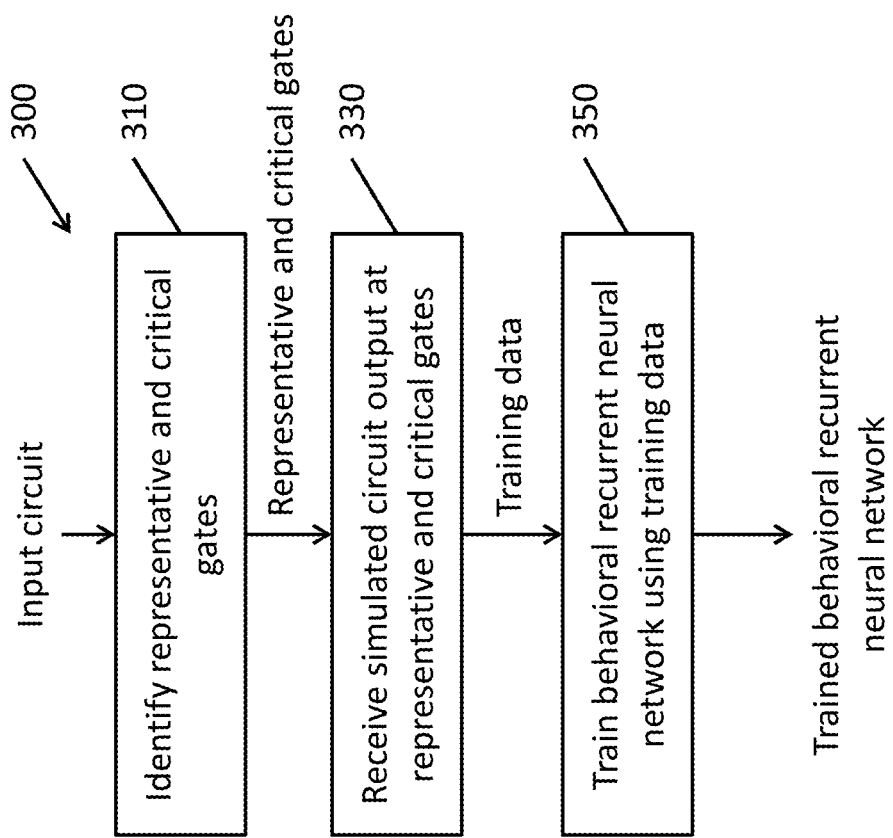
FIG. 3 is a flowchart of a method according to one embodiment of the present invention for training a recurrent neural network circuit simulator to simulate a particular circuit.

FIG. 3 is a flowchart of a method 300 according to one embodiment of the present invention for training a recurrent neural network circuit simulator to simulate a particular circuit. For the sake of discussion, the training of the recurrent neural network simulator is described as the separate training of different stages of a pipeline of networks (e.g., the behavioral RNN 100 stage, the feature engine 130 stage, and the physics RNN 150 stage). However, embodiments of the present invention are not limited thereto. For example, multiple stages can be trained together. For example, in some embodiments the entire network, including the behavioral RNN 100 stage, the feature engine 130 stage, and the physics RNN 150 stage, is trained in an end-to-end manner.

A given circuit to be simulated may be supplied in the form of a circuit netlist. This circuit netlist may be produced by an electronic design automation (EDA) tool, and prepared by a human design engineer. In some circumstances, such as in the case of large-scale circuits, in order to reduce the complexity of the model and in order to reduce training time, in operation 310, a training system for training the recurrent neural network selects or identifies representative and critical gates (RCG) and the behavior of their nodes to be simulated. In some embodiments, correlation (decomposition) methods such as principal component analysis (PCA) (see, e.g., K. Pearson, "On Lines and Planes of Closest Fit to Systems of Points in Space," *Philosophical Magazine*, 2, pp. 559-572, 1901), auto-encoders (see, e.g., Y. Bengio, "Learning Deep Architectures for AI," *Foundations and Trends in Machine Learning*, 2009), factor analysis (see, e.g., D. Child, "The Essentials of Factor Analysis," *Continuum International*, 2006) may be used to identify the representative and critical gates automatically from the circuit netlist. In some embodiments of the present invention, domain knowledge, such as a critical delay path, worst or most heavily degraded gates, or most heavily used gates may also be used to select the representative and critical gates.

In operation 330, the training system receives simulated waveforms from a comparative simulator (e.g., SPICE) that is configured to simulate the output of the supplied input circuit, and/or voltages at particular nodes of the circuit, for one or more given input waveforms. The input waveform and the voltage waveforms generated by the comparative simulator (e.g., SPICE) form a set of training data for training a behavioral RNN to simulate or approximate the output waveforms at RCG nodes $out_1$, $out_3$, and $out_7$ of the circuit shown in FIG. 2A. (In some embodiments, additional input waveforms and their corresponding output waveforms may also be used to generate training data.) In some embodiments, the training system controls the simulator (e.g., SPICE) to generate the training data.

In operation 350, the training system trains the behavioral RNN using the given training data from the simulator. The training may be performed using standard techniques for training recurrent neural networks to compute parameters of the recurrent neural network, including the weights W of the connections. These training techniques include, for example, a backpropagation through time (BPTT) training algorithm (see, e.g., P. J. Werbos, "Backpropagation through time: what it does and how to do it," *Proc. IEEE*, 78, 10, pp.

1550-1560, 1990). However, over a long term, BPTT tends to have gradients that either vanish (e.g., go to zero) or explode (e.g., increase without bound). Accordingly, various techniques for improving the training process are described, for example, in T. Lin, "Learning long-term dependencies is not as difficult with NARX recurrent neural networks," *IEEE Trans. Neural Networks*, 7, pp. 1329-1338, 1996, S. Singhal, "Training Multilayer Perceptrons with the Extended Kalman Algorithm," *Advances in Neural Information Processing Systems*, pp. 133-140, 1989, H. Jaeger, "Adaptive Non-Linear System Identification with Echo State Networks," *Proceedings of NIPS*, pp. 609-616, 2002, S. Hochreiter et. al., "Long Short-Term Memory," *Journal of Neural Computation*, 9, pp. 1735-1780, 1997, and K. Cho et. al., "Learning Phrase Representations using RNN Encoder-Decoder for Statistical Machine Translation," *Proc. EMNLP*, 2014.

FIG. 2C is a set of waveforms showing a testing input waveform supplied to a circuit, output waveforms at three different nodes of the circuit shown in FIG. 2A as computed by a comparative simulator, and output waveforms as computed by the behavioral RNN according to one embodiment of the present invention, trained based on the training data shown in FIG. 2B. The comparative simulator in this example is SPICE, which generated the waveforms shown in solid lines, and the output of the behavioral RNN is shown with dashed lines.

As seen in FIGS. 2B and 2C, the output of the behavioral RNN (dashed lines) tracks the output of SPICE (solid lines). In more detail, the experiment was repeated with behavioral RNNs having different numbers of layers and different numbers of neurons. The results of these experiments are summarized in Table 1, below:

TABLE 1

|  | (Error Units: %) | 3-stage inverter chain # of nodes = 3 | | | | 7-stage inverter chain # of nodes = 7 | | | |
| --- | --- | --- | --- | --- | --- | --- | --- | --- | --- |
|  | # of layers | 1 | 2 | 2 | 4 | 2 | 2 | 4 | 4 |
|  | # of neurons | 4 | 4 | 8 | 4 | 4 | 8 | 4 | 8 |
| Training | Avg. Error | 0.71 | 0.55 | 0.49 | 0.87 | 1.73 | 0.93 | 1.68 | 0.97 |
|  | Max Error | 0.93 | 0.72 | 0.61 | 0.99 | 2.47 | 1.13 | 2.01 | 1.05 |
| Testing | Avg. Error | 0.97 | 0.80 | 0.81 | 0.86 | 2.14 | 1.27 | 1.96 | 1.20 |
|  | Max Error | 1.73 | 0.91 | 0.84 | 1.08 | 4.78 | 1.64 | 2.33 | 1.45 |

As shown in Table 1, above, a two-layer RNN can achieve good accuracy with a reasonable training turn-around-time. In addition, as shown in Table 1, increasing the number of neurons in each layer can provide better performance improvements (reduced error) than increasing the number of layers (also referred to as the depth of the neural network).

Accordingly, the behavioral RNN 100 can be trained to simulate the output of a pristine circuit using training data supplied from a simulation of a pristine circuit.

Feature Engine and Physics Recurrent Neural Network

Figure 4:
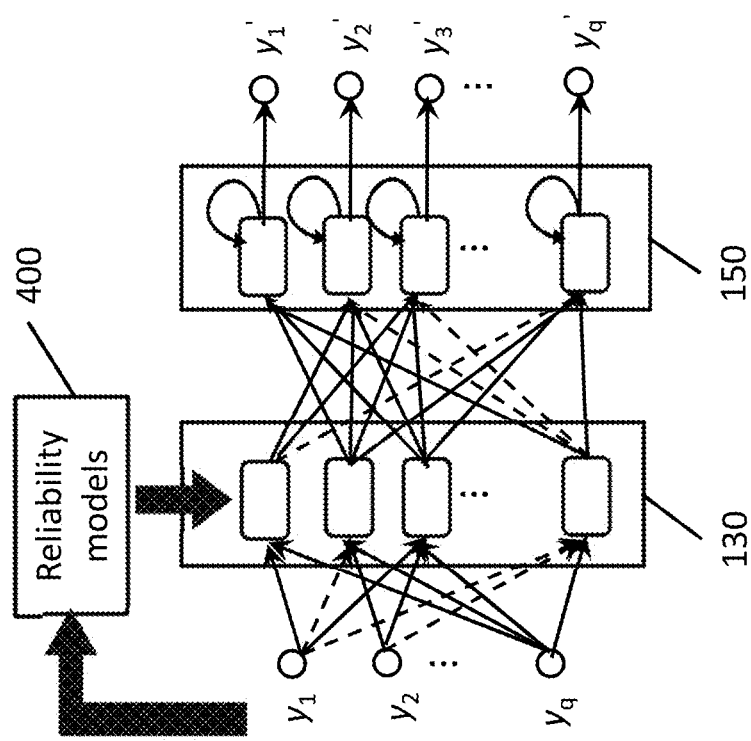
FIG. 4 is a schematic diagram illustrating connections between a behavioral recurrent neural network, a feature network, and a physical neural network in accordance with one embodiment of the present invention.

FIG. 4 is a schematic diagram illustrating connections between a behavioral recurrent neural network, a feature network, and a physical neural network in accordance with one embodiment of the present invention.

Some aspects of embodiments of the present invention relate to a feature engine 130 configured to compute neural network features based on the physical device models (e.g., characteristics) of the transistors being simulated in order to account for performance degradations of the transistors. The features generated by the feature engine 130 are then supplied to a physics (or physically inspired) recurrent neural network 150 to compute a simulated degraded output waveform.

The feature engine 130 is configured based on device reliability modeling based on experimentally derived models that describe effects such as bias-temperature instability (BTI), hot carrier injection (HCI), and random telegraph noise (RTN). According to one embodiment of the present invention, the feature engine 130 includes a single layer of neurons, where each neuron of the feature engine 130 corresponds to a transistor of the network (e.g., transistors corresponding to the representative and critical gates selected in operation 310).

According to one embodiment of the present invention, the physical characteristics of transistors of the circuit are modeled using macro-models. Generally, complementary metal oxide semiconductor (CMOS) circuits exhibit input-output isolation (ignoring the feedthrough effect and pass-gate transistors), so that circuits are non-reciprocal. Accordingly, the physical degradation of a transistor and its effect on its output voltage $V_i'$ can be modeled as a dynamic system:

$$\frac{dV_i'(t)}{dt} = g\left[\sum_j f_j(t), V_i(t), V_i'(t)\right]$$

where $V_i(t)$ represents the pristine voltage of a node i, $V_i'(t)$ represents a degraded voltage of the node i, g is an activation function (e.g., a non-linear activation function such as hyperbolic tangent), and where $f_j(t)$ represents transistor drain current fluctuations:

$$f_j = \frac{\Delta I_{ds,j}}{I_{ds,j}}$$

where $I_{ds,j}$ is a drain-source current from the j transistors that have source or drain terminals connected to node i. Recurrent neural networks are suited to modeling dynamic systems that can be described using differential algebraic equations (DAE). Furthermore, at least some of the various non-linear functions used in activation functions g of neural networks are also commonly used in models of transistor behavior (which often exhibit non-linear physical degradation characteristics).

In some embodiments, the current-voltage characteristics (I-V) of a metal oxide field effect transistor (MOSFET) of a circuit, in particular, the relationship between the drain-source current and the gate-source voltage ($I_{ds}$-$V_{gs}$) is modeled as follows:

$$I_{ds} = I_{ds,0} \cdot \sigma(WV_{gs}+b) \cdot \tan h(V_{ds})$$

where σ represents a sigmoid function given, for example, by:

$$\sigma(Wx+b) = \frac{1}{1+e^{-(Wx+b)}}$$

where this relationship captures the sub-threshold ON-state performance of the MOSFET, where W and b are learned parameters, where $V_{gs}$ is a gate-source voltage of the MOSFET, and where $V_{ds}$ is a drain-source voltage of the MOSFET.

Accordingly, in some embodiments, transistor drain current fluctuations can be derived using the above expression for $I_{ds}$ as:

$$f(t) = \Delta V_t(t,t_s)W[1 - \sigma(WV_{gs}(t)+b)] + \frac{\Delta I_{ds}}{I_{ds}}(t,t_s)$$

where W and b are learned parameters for each neuron in the feature engine, t represents a time point within the simulation (e.g., a time point within the waveform), and $t_s$ represents an aging time (e.g., long term on the order of thousands of seconds to millions of second or more). The $\alpha V_t(t,t_s)$ term and $$\frac{\Delta I_{ds}}{I_{ds}}(t,t_s)$$

term correspond to degraded transistor parameters due to aging (stress time is $t_s$) and transient noise at time t.

Referring to FIG. 4, the inputs $(y_1, y_2, \ldots, y_q)$ correspond to the outputs of the behavioral RNN 100 (e.g., a simulated output waveforms of a pristine circuit) where each of the q inputs $(y_1, y_2, \ldots, y_q)$ corresponds to a voltage waveform at a particular simulated node in the circuit, as represented by a sequence of values over time t=1, 2, ..., n (e.g., $y_1 = (y_{1,1}, y_{1,2}, \ldots, y_{1,n})$. These may correspond to the voltages at gate terminals of the representative and critical gates of particular ones of the transistors. The simulated pristine output waveform is used to calculate the transistor performance degradations due to reliability issues using fast, closed-form expressions. The reliability issue-induced degradation models 400 may be generated in accordance with the models of transistor behavior specified above, as parameterized by an aging time $t_s$. The behavioral RNN 100 is fully connected to the feature engine 130, and therefore all of the values $(y_1, y_2, \ldots, y_q)$ are supplied to every neuron of the feature engine 130. Each neuron of the feature engine corresponds to one transistor of the representative and critical gates (RCG) of the circuit, and each neuron implements the function ƒ (t) listed above to compute degraded features, the degraded features modeling the degraded behavior of the corresponding MOSFETs. In some embodiments, the neurons of the feature engine 130 are connected to selected ones of the neurons in the physics RNN 150 based on connections within the circuits. The physics RNN 150 is, in turn, trained or configured to simulate degraded output waveforms $(y_1', y_2', \ldots, y_q')$, where each neuron of the physics RNN 150 corresponds to a source terminal or a drain terminal of the transistors of the representative and critical gates (RCG). The training data may include degraded output waveforms computed by a conventional simulator (e.g., SPICE) based on transistor reliability models.

Figure 5:
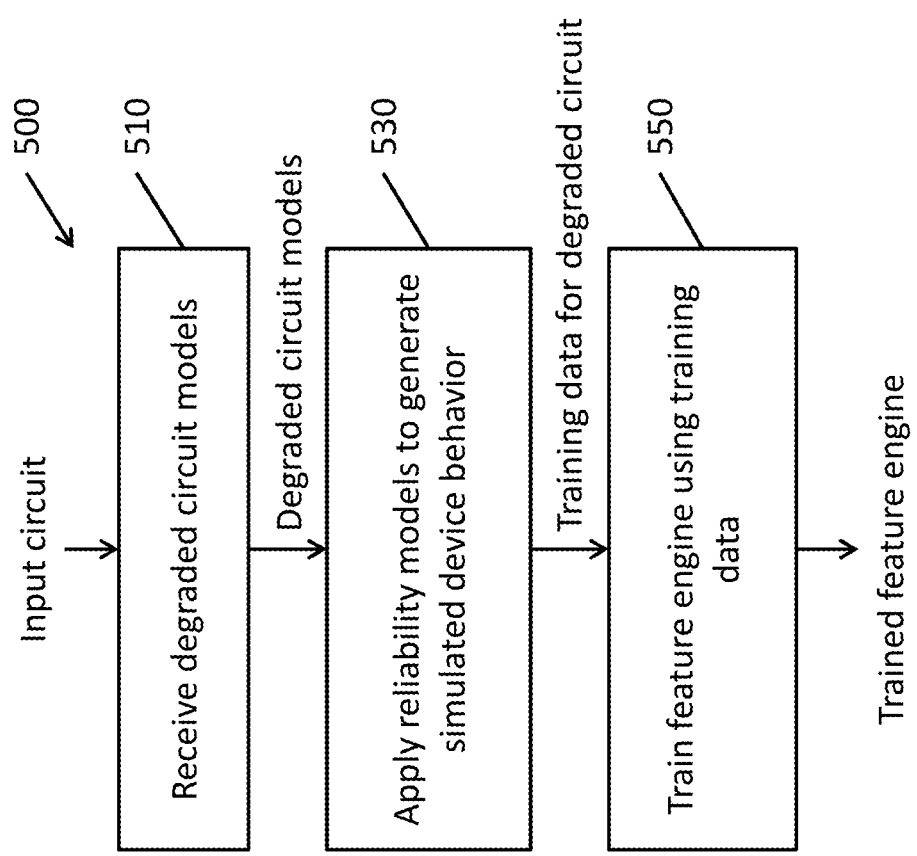
FIG. 5 is a flowchart of a method for training a feature engine according to one embodiment of the present invention.

FIG. 5 is a flowchart of a method for training the feature engine according to one embodiment of the present invention. The parameters W and b of the activation function ƒ (t) of the neurons of the feature layer can be trained by applying backpropagation rather than backpropagation through time (BPTT). On the other hand, in embodiments of the present invention, the reliability models 400 are used to compute training labels based on the simulated pristine waveforms $(y_1, y_2, \ldots, y_q)$ from the behavioral RNN 100. The gradients for performing back propagation on the parameters W and b can be expressed as:

$$\frac{\partial L}{\partial W_j} = \sum_i \frac{\partial L}{\partial g_i} \cdot \frac{\partial g_i}{\partial f_j} \cdot \frac{\partial f_j}{\partial W_j} \Longrightarrow \frac{\partial f_j}{\partial W_j} =$$

$$\Delta V_{t,j}(t,t_{s,j})[1 - \sigma_j - W_j V_{gs,j}(t)\sigma_j(1-\sigma_j)]$$

$$\frac{\partial L}{\partial b_j} = \sum_i \frac{\partial L}{\partial g_i} \cdot \frac{\partial g_i}{\partial f_j} \cdot \frac{\partial f_j}{\partial b_j} \Longrightarrow \frac{\partial f_j}{\partial b_j} = \Delta V_{t,j}(t,t_{s,j})[-W_j\sigma_j(1-\sigma_j)]$$

Figure 6:
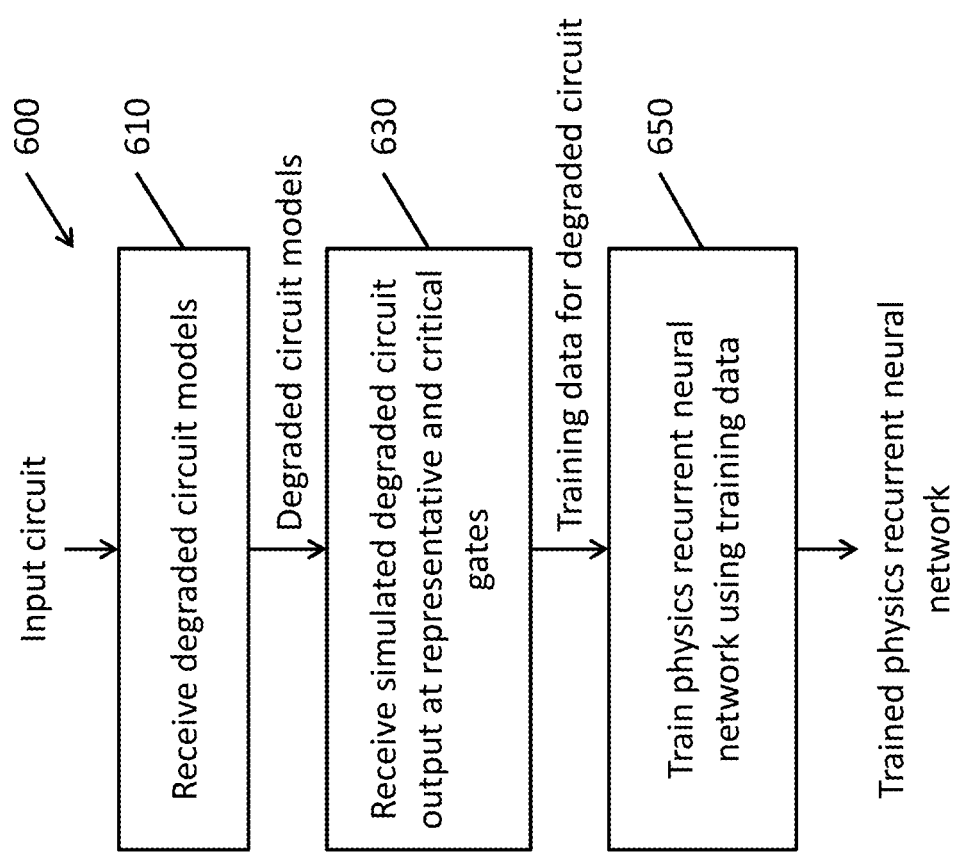
FIG. 6 is a flowchart of a method for training a physics recurrent neural network according to one embodiment of the present invention.

FIG. 6 is a flowchart of a method for training the physics RNN according to one embodiment of the present invention. In operation 610, the training system receives degraded circuit models as generated by a reliability modeling process. This is similar to the comparative case, where reliability modeling is used to characterize the long-term degradation (e.g., aging) of circuit elements in the form of, for example, bias-temperature instability (BTI), hot carrier injection (HCI), and random telegraph noise (RTN). In operation 630, the training system receives simulated output of a degraded circuit at representative and critical gates (RCG) (e.g., the RCG selected in operation 310). The simulated output may be generated by a comparative circuit simulator such as SPICE, where the degraded or aged or stressed circuit simulated by SPICE is generated through post-processing in accordance with the degraded circuit models (or reliability models). This simulated output from the comparative circuit simulator, along with the corresponding features generated by the feature network, serve as training data for training the physics RNN 150 in operation 650 using a training technique such as a modified version of backpropagation through time (BPTT) to account for (or reduce the effect of) vanishing or exploding gradients, as described above with respect to the training of the behavioral RNN 100.

To test the performance of a recurrent neural network circuit simulator according to embodiments of the present invention, the aging of the multi-stage inverter circuit shown in FIG. 2A was simulated with stress times $i_s$ of 10 seconds, 1,000 seconds, and 100,000 seconds, and these simulated results were used, sequentially, to train recurrent neural network circuit simulators according to various embodiments of the present invention.

Figure 7A:
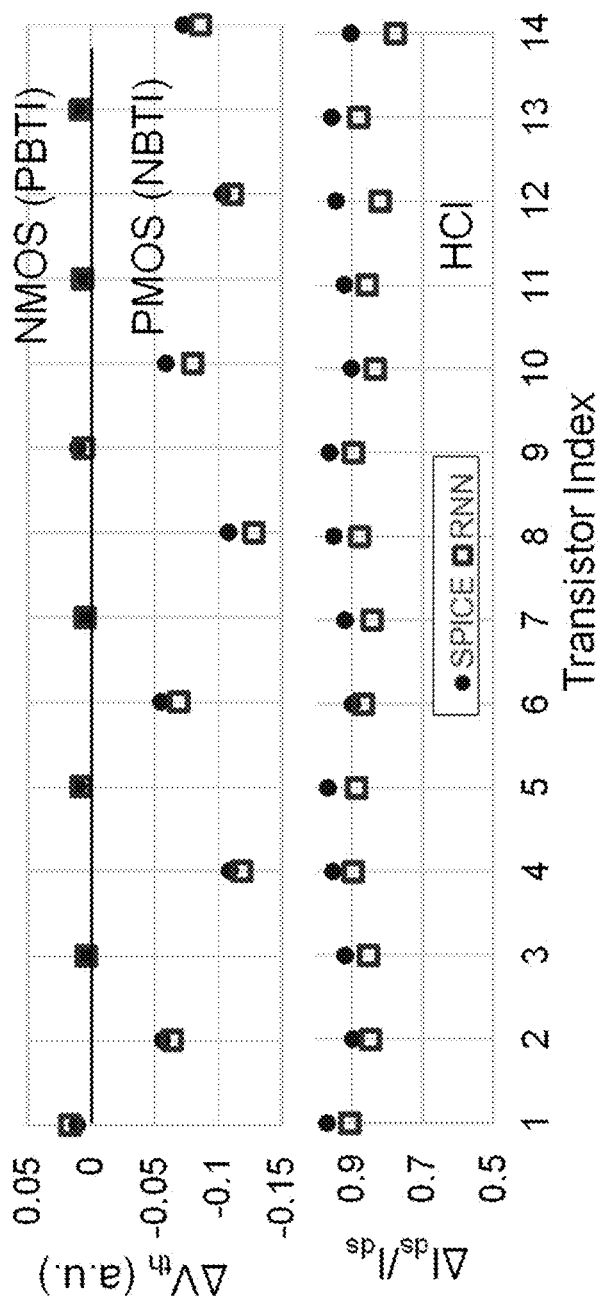
FIG. 7A is a graph comparing the bias-temperature instability (BTI) ($\Delta V_{th}$) and hot carrier injection (HCI) ($\Delta I_{ds}/I_{ds}$) degradation values for fourteen (14) different transistors of the multi-stage inverter circuit shown in FIG. 2A, as calculated by a comparative circuit simulator (SPICE) and as calculated by a recurrent neural network circuit simulator according to an embodiment on the present invention.

FIG. 7A includes graphs comparing the bias-temperature instability (BTI) ($\Delta V_{th}$) and hot carrier injection (HCI) ($\Delta I_{ds}/I_{ds}$) degradation values for fourteen (14) different transistors of the multi-stage inverter circuit shown in FIG. 2A, as calculated by a comparative circuit simulator (SPICE) and as calculated by a recurrent neural network circuit simulator according to an embodiment on the present invention. As shown in FIG. 7A, the values calculated by a recurrent neural network according to embodiments of the present invention (shown by the boxes) closely tracks the values calculated by SPICE (shown by the circles).

FIG. 7B depicts output waveforms at node $out_3$ of the multi-stage inverter circuit shown in FIG. 2A, as computed by a comparative circuit simulator simulating a pristine circuit ("Pristine-SPICE"), a comparative circuit simulator simulating an aged circuit ("Aged-SPICE"), and a recurrent neural network circuit simulator simulating an aged circuit ("Aged-RNN").

FIG. 7C depicts output waveforms at node $out_7$ of the multi-stage inverter circuit shown in FIG. 2A, as computed by a comparative circuit simulator simulating a pristine circuit ("Pristine-SPICE"), a comparative circuit simulator simulating an aged circuit ("Aged-SPICE"), and a recurrent neural network circuit simulator simulating an aged circuit ("Aged-RNN").

As seen in FIGS. 7B and 7C, the waveforms computed by the recurrent neural network circuit simulator according to embodiments of the present invention (shown in dashed lines) closely tracks the waveforms computed by the comparative circuit simulator simulating an aged circuit. As such, the physically-inspired recurrent neural network circuit according to embodiments of the present invention is capable of predicting output waveforms of a degraded circuit directly using its pristine counterpart and aging-incorporated features, with a relatively simple topology compared to a multi-layer behavioral RNN. In some embodiments, the number of recurrent neurons corresponds to the number of circuit nodes of interest (e.g., selected during the stage of selecting representative and critical gates).

Table 2 summarizes the performance of a trained recurrent neural network circuit simulator having a behavioral RNN (B-RNN) with two layers and 8 neurons and a physics RNN (II-RNN) with two layers and 7 neurons:

TABLE 2

| | B-RNN: # of layers = 2, # of neurons = 8 II-RNN: # of layers = 2, # of neurons = 7 | | | | |
| | Stress time ($t_s$) | | | | |
| (Error Units: %) | Train1 10 s | Train2 $10^3$ s | Train3 $10^5$ s | Test1 $2 \times 10^2$ s | Test2 $2 \times 10^4$ s |
|---|---|---|---|---|---|
| Avg. Error | 1.26 | 1.47 | 2.33 | 1.52 | 2.91 |
| Max Error | 1.89 | 2.06 | 1.97 | 2.70 | 3.61 |

Applications to More Complex Circuits

Figure 8A:
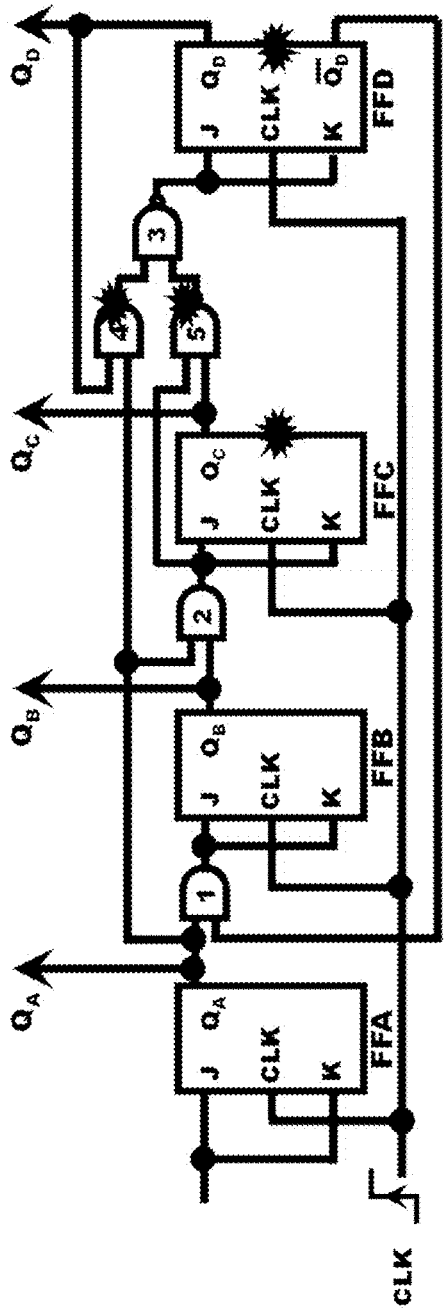
FIG. 8A depicts a JK flip flop-based decimal counter circuit, using four JK flip-flops, which was used in an experiment.
Figure 8C:
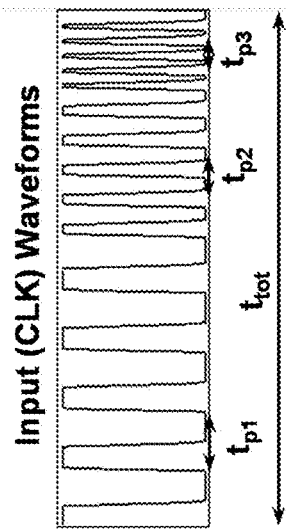
FIG. 8C depicts an input clock (CLK) waveform to the JK flip flop-based decimal counter circuit.
Figure 8B:
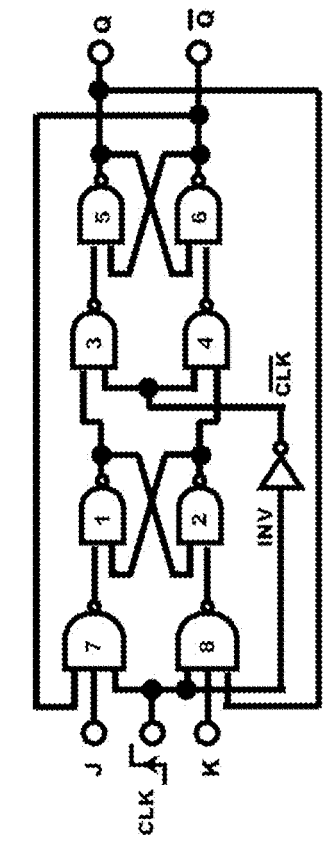
FIG. 8B is a circuit diagram of one JK flip flop.

The performance of recurrent neural network circuit simulators according to embodiments of the present invention were further tested on more complex circuits. FIG. 8A depicts a JK flip flop-based decimal counter circuit, using four JK flip-flops, which was used in an experiment. FIG. 8B is a circuit diagram of one JK flip flop, and FIG. 8C depicts an input clock (CLK) waveform to the JK flip flop-based decimal counter circuit.

Due to the complexity of the circuit, representing all of the transistors in the circuit (e.g., in the feature engine 130) may result in a very large recurrent neural network, which may be very time consuming and resource intensive (e.g., in both computing time and memory) to train. Accordingly, a representative and critical gate (RCG) selection process, as described above with respect to operation 310 can be used to select a reduced number of transistors to be represented in the recurrent neural network, such that the recurrent neural network is of reasonable scale (for purposes of training turn-around-time and resource usage). For example, domain knowledge regarding the transistors may be used to select the transistors with the heaviest workloads as part of the RCG for simulation because these transistors have the greatest aging degradations. As another example, transistors along the critical delay path may be selected as part of the RCG for simulation.

FIG. 8D is a schematic illustration of a portion of recurrent neural network including the feature engine 130 and the physics RNN 150 representing the JK flip flop-based decimal counter circuit shown in FIG. 8A. In the embodiment shown in FIG. 8D, there are five representative gates, and the behavioral RNN 100 outputs waveforms ($y_1$, $y_2$, $y_3$, $y_4$, $y_5$) corresponding to the pristine waveforms supplied to those gates. In the embodiment shown in FIG. 8D, the feature engine 130 includes thirteen (13) neurons configured to compute features of thirteen different critical transistors of the circuit. These degraded features are then supplied as inputs to some of the neurons in the physics RNN 150, where the connections between the neurons of the feature engine 130 and the physics RNN 150 are selected based on the actual relationships within the circuit.

Figure 9A:
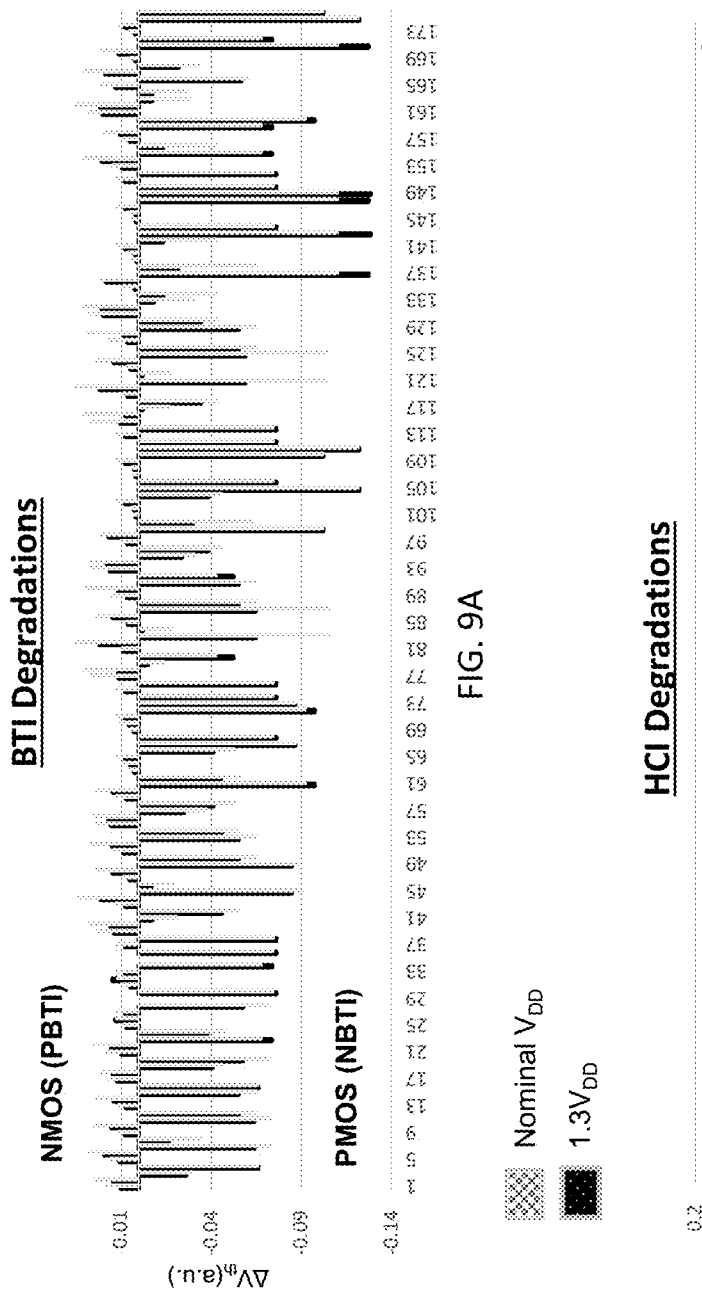
FIG. 9A is a graph showing bias-temperature instability (BTI) ($\Delta V_{th}$) degradations for the selected representative critical gates (RCG) of the circuit shown in FIG. 8A, as computed by a recurrent neural network circuit simulator according to one embodiment of the present invention.
Figure 9B:
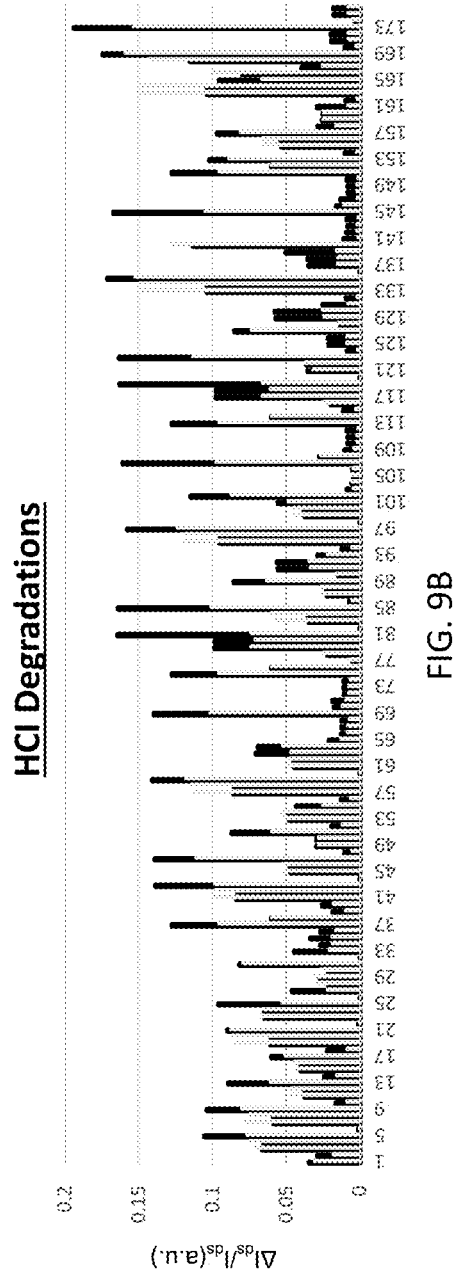
FIG. 9B is a graph showing hot carrier injection (HCI) ($\Delta I_{ds}/I_{ds}$) degradations for the selected RCGs of the circuit shown in FIG. 8A, as computed by a recurrent neural network circuit simulator according to one embodiment of the present invention.

FIG. 9A is a graph showing bias-temperature instability (BTI) ($\Delta V_{th}$) degradations for various gates of the circuit shown in FIG. 8A, as computed by a comparative circuit simulator according to one embodiment of the present invention. FIG. 9B is a graph showing hot carrier injection (HCI) ($\Delta I_{ds}/I_{ds}$) degradations for various gates of the circuit shown FIG. 8A, as computed by a comparative circuit simulator according to one embodiment of the present invention. In FIGS. 9A and 9B, simulations were performed using different supply voltages: nominal $V_{DD}$ and 1.3 times the nominal $V_{DD}$ ($1.3V_{DD}$), where the higher supply voltage is used to induce accelerated transistor degradation. In some embodiments of the present invention, the gates with the most simulated degradation (e.g., largest magnitude values of $\Delta V_{th}$ and/or highest values of $\Delta I_{ds}/I_{ds}$) from among the gates shown in FIGS. 9A and 9B are selected as the representative and critical gates.

As such, recurrent neural networks in accordance with aspects of embodiments of the present invention accurately simulate the output waveforms of complex circuits as the circuits degrade over time, without requiring the resource-intensive simulation of a complete circuit using comparative simulation techniques such as SPICE. Furthermore, Furthermore, because the aging time $t_s$ is merely another input parameter to the feature network 130, a trained recurrent neural network circuit simulator according to embodiments of the present invention can be reconfigured, without substantial additional effort (e.g., retraining) to predict an output waveform for arbitrary aging times $t_s$, whereas in comparative systems, a new set of degraded circuit models would have been created and a completely new simulation with the new degraded circuits would have been performed (e.g., using SPICE).

Hardware

Aspects of embodiments of the present invention may be implemented in computing systems configured to implement neural networks, such as using one or more computers, which may include a central processing unit (CPU) and memory. The memory may store instructions that implement methods described herein, including methods for operating a trained neural network (e.g., supplying input waveforms to a trained neural network), and to implement a training system (e.g., loading training data, storing the architecture of the neural network, storing and calculating the weights W and the biases b of the neural networks, and the like). Some aspects of embodiments of the present invention may be implemented in part or in whole using specialized hardware such as a CPU having vector registers, a graphics processing unit (GPU), a field programmable gate array (FPGA), an application specific integrated circuit (ASIC) or other specialized hardware.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A circuit simulator configured to simulate a degraded output of a circuit comprising a plurality of transistors, the circuit simulator comprising:
    a behavioral recurrent neural network (RNN) comprising a plurality of neurons, each neuron of the behavioral RNN computing a non-linear activation function as a weighted sum of inputs to the neuron in accordance with a plurality of parameters of the behavioral RNN, the plurality of neurons of the behavioral RNN being configured to receive an input waveform comprising a discrete time sequence of input values and to compute a circuit output waveform comprising a discrete time sequence of output values;
    a feature engine comprising a plurality of neurons, each neuron of the feature engine computing a non-linear activation function as a weighted sum of inputs to the neuron in accordance with a plurality of parameters of the feature engine, the plurality of neurons of the feature engine being configured to receive the circuit output waveform and to output a plurality of degraded features based on reliability models of the transistors of the circuits and in accordance with an aging time; and
    a physics recurrent neural network (RNN) comprising a plurality of neurons, each neuron of the physics RNN computing a non-linear activation function as a weighted sum of inputs to the neuron in accordance with a plurality of parameters of the physics RNN, the plurality of neurons of the physics RNN being configured to receive the plurality of degraded features from the feature engine and to simulate the degraded output of the circuit, the degraded output of the circuit comprising a discrete time series of degraded output values.

2. The circuit simulator of claim 1, wherein the parameters of the behavioral RNN are trained in accordance with training data comprising:
    an input waveform; and
    simulated pristine circuit output waveforms of the circuit in response to the input waveform, simulated by a full circuit simulator.

3. The circuit simulator of claim 1, wherein the parameters of the feature engine are trained in accordance with training data comprising simulated device behavior based on the reliability models of the transistors of the circuit.

4. The circuit simulator of claim 3, wherein the parameters of the physics RNN are trained in accordance with training data comprising:
    an input waveform;
    the degraded features computed by the feature engine; and
    simulated degraded circuit output waveforms of the circuit in response to the input waveform at a simulated aging time.

5. The circuit simulator of claim 1, wherein the behavioral recurrent neural network, the feature engine, and the physics recurrent neural network are end-to-end trained by training data, the training data comprising:
    an input waveform;
    first simulated degraded circuit output waveforms of the circuit in response to the input waveform at a first simulated aging time, simulated by a full circuit simulator; and
    second simulated degraded circuit output waveforms of the circuit in response to the input waveform at a second simulated aging time, simulated by the full circuit simulator.

6. The circuit simulator of claim 1, wherein each neuron of the feature engine corresponds to one of the transistors of a plurality of representative and critical gates, the plurality of representative and critical gates being selected from among the transistors of the circuit in accordance with a decomposition method.

7. The circuit simulator of claim 1, wherein each neuron of the feature engine corresponds to one of the transistors of a plurality of representative and critical gates, the plurality of representative and critical gates being selected from among the transistors of the circuit in accordance with a critical delay path, most degraded gates, or most heavily used gates of the circuit.

8. The circuit simulator of claim 1, wherein the degraded features computed by the feature engine relate to bias-temperature instability, hot carrier injection, and random telegraph noise characteristics of the transistors of the circuit.

9. A method for simulating a degraded output of a circuit comprising a plurality of transistors, the method comprising:
    supplying an input waveform comprising a discrete time sequence of input values to a behavioral recurrent neural network (RNN) comprising a plurality of neurons, each neuron of the behavioral RNN computing a non-linear activation function as a weighted sum of inputs to the neuron in accordance with a plurality of parameters of the behavioral RNN, the plurality of neurons of the behavioral RNN being configured to compute a circuit output waveform comprising a discrete time sequence of output values from the input waveform;
    supplying the circuit output waveform to a feature engine comprising a plurality of neurons, each neuron of the feature engine computing a non-linear activation function as a weighted sum of inputs to the neuron in accordance with a plurality of parameters of the feature engine, the plurality of neurons of the feature engine being configured to compute a plurality of degraded features from the circuit output waveform based on reliability models of the transistors of the circuit and in accordance with an aging time; and
    supplying the plurality of degraded features to a physics recurrent neural network (RNN) comprising a plurality of neurons, each neuron of the physics RNN computing a non-linear activation function as a weighted sum of inputs to the neuron in accordance with a plurality of parameters of the physics RNN, the plurality of neurons of the physics RNN being configured to simulate the degraded output of the circuit, the degraded output of the circuit comprising a discrete time series of degraded output values.

10. The method of claim 9, wherein the parameters of the behavioral RNN are trained in accordance with training data comprising:
- an input waveform; and
- simulated pristine circuit output waveforms of the circuit in response to the input waveform, simulated by a full circuit simulator.

11. The method of claim 9, wherein the parameters of the feature engine are trained in accordance with training data comprising simulated device behavior based on the reliability models of the transistors of the circuit.

12. The method of claim 11, wherein the parameters of the physics RNN are trained in accordance with training data comprising:
- an input waveform;
- the degraded features computed by the feature engine; and
- simulated degraded circuit output waveforms of the circuit in response to the input waveform at a simulated aging time.

13. The method of claim 9, wherein the behavioral recurrent neural network, the feature engine, and the physics recurrent neural network are end-to-end trained by training data, the training data comprising:
- an input waveform;
- first simulated degraded circuit output waveforms of the circuit in response to the input waveform at a first simulated aging time, simulated by a full circuit simulator; and
- second simulated degraded circuit output waveforms of the circuit in response to the input waveform at a second simulated aging time, simulated by the full circuit simulator.

14. The method of claim 9, further comprising selecting a plurality of representative and critical gates from among the transistors of the circuit in accordance with a decomposition method,
wherein each neuron of the feature engine corresponds to one of the transistors of the plurality of representative and critical gates.

15. The method of claim 9, further comprising selecting a plurality of representative and critical gates from among the transistors of the circuit in accordance with a critical delay path, most degraded gates, or most heavily used gates of the circuit,
wherein each neuron of the feature engine corresponds to one of the transistors of the plurality of representative and critical gates.

16. The method of claim 9, wherein the degraded features computed by the feature engine relate to bias-temperature instability and hot carrier injection characteristics of the transistors of the circuit.

17. A system for simulating a degraded output of a circuit comprising a plurality of transistors, the system comprising:
- means for computing a circuit output waveform comprising a discrete time sequence of output values from an input waveform comprising a discrete time sequence of input values;
- means for computing a plurality of degraded features from the circuit output waveform based on reliability models of the transistors of the circuits and in accordance with an aging time; and
- means for simulating the degraded output of the circuit based on the plurality of degraded features, the degraded output of the circuit comprising a discrete time series of degraded output values.

18. The system of claim 17, wherein the means for computing the circuit output waveform from the input waveform comprises a behavioral recurrent neural network configured by a plurality of parameters, the parameters being trained in accordance with training data comprising:
- an input waveform; and
- simulated pristine circuit output waveforms of the circuit in response to the input waveform, simulated by a full circuit simulator.

19. The system of claim 17, wherein the means for computing the plurality of degraded features comprises a feature engine configured by a plurality of parameters, the parameters being trained in accordance with training data comprising simulated device behavior based on reliability models of the transistors of the circuit.

20. The system of claim 19, wherein the means for simulating the degraded output of the circuit comprises a physics recurrent neural network configured by a plurality of parameters, the parameters being trained in accordance with training data comprising:
- an input waveform;
- the degraded features computed by the feature engine; and
- simulated degraded circuit output waveforms of the circuit in response to the input waveform at a simulated aging time.

21. The system of claim 17, wherein the means for computing the circuit output waveform, the means for computing the plurality of degraded features, and the means for simulating the degraded output are end-to-end trained by training data, the training data comprising:
- an input waveform;
- first simulated degraded circuit output waveforms of the circuit in response to the input waveform at a first simulated aging time, simulated by a full circuit simulator; and
- second simulated degraded circuit output waveforms of the circuit in response to the input waveform at a second simulated aging time, simulated by the full circuit simulator.

22. The system of claim 17, further comprising means for selecting a plurality of representative and critical gates from among the transistors of the circuit in accordance with a decomposition method,
wherein the means for computing the plurality of degraded features comprises a plurality of neurons, each neuron corresponding to one of the transistors of the plurality of representative and critical gates.

23. The system of claim 17, further comprising means for selecting a plurality of representative and critical gates from among the transistors of the circuit in accordance with a critical delay path, most degraded gates, or most heavily used gates of the circuit,
wherein the means for computing the plurality of degraded features comprises a plurality of neurons, each neuron corresponding to one of the transistors of the plurality of representative and critical gates.

24. The system of claim 17, wherein the degraded features relate to bias-temperature instability and hot carrier injection characteristics of the transistors of the circuit.

* * * * *